United States Patent
Hassner et al.

(10) Patent No.: US 8,166,376 B2
(45) Date of Patent: Apr. 24, 2012

(54) TECHNIQUES FOR CORRECTING ERRORS AND ERASURES USING A SINGLE-SHOT GENERALIZED MINIMUM DISTANCE KEY EQUATION SOLVER

(75) Inventors: Martin Hassner, Mountain View, CA (US); Travis Roger Oenning, Rochester, MN (US); Richard Leo Galbraith, Rochester, MN (US)

(73) Assignee: Hitachi Global Storage Technologies Netherlands, B. V., Amsterdam (NL)

( * ) Notice: Subject to any disclaimer, the term of this patent is extended or adjusted under 35 U.S.C. 154(b) by 1051 days.

(21) Appl. No.: 12/099,532

(22) Filed: Apr. 8, 2008

(65) Prior Publication Data

US 2009/0254796 A1    Oct. 8, 2009

(51) Int. Cl.
G06F 11/00    (2006.01)
(52) U.S. Cl. .................................. 714/781; 714/780
(58) Field of Classification Search .................. None
See application file for complete search history.

(56) References Cited

U.S. PATENT DOCUMENTS

| | | | |
|---|---|---|---|
| 6,553,536 B1 | 4/2003 | Hassner et al. | |
| 6,792,569 B2 | 9/2004 | Cox et al. | |
| 2002/0170018 A1 | 11/2002 | Cox et al. | |
| 2005/0229069 A1 | 10/2005 | Hassner et al. | |
| 2007/0061688 A1 | 3/2007 | Hassner et al. | |

OTHER PUBLICATIONS

G. David Forney, Jr., "Generalized Minimum Distance Decoding", Apr. 1966, IEEE Transactions on Information Theory, vol. IT-12, No. 2, pp. 125-131.*

Luca Reggiani, and Guido Tartara, "On Reverse Concatenation and Soft Decoding Algorithms for PRML Magnetic Recording Channels," IEEE Journal on Selected Areas in Communications, vol. 19, No. 4, Apr. 2001, pp. 612-618.

* cited by examiner

*Primary Examiner* — Michael Maskulinski
(74) *Attorney, Agent, or Firm* — Steven J. Cahill

(57) ABSTRACT

A system corrects errors in a codeword. The system includes a channel that sorts reliability numbers of symbols in the codeword to create an ordered list of candidate erasure locations. The system also includes a generalized minimum distance decoder that iteratively processes the ordered list of candidate erasure locations and at least two syndromes of the codeword using a single-shot key equation solver to generate an error locator polynomial and an error evaluator polynomial. The generalized minimum distance decoder processes the least reliable candidate erasure locations first within the ordered list of candidate erasure locations.

20 Claims, 5 Drawing Sheets

TECHNIQUES FOR CORRECTING ERRORS AND ERASURES USING A SINGLE-SHOT GENERALIZED MINIMUM DISTANCE KEY EQUATION SOLVER

BACKGROUND OF THE INVENTION

The present invention relates to error correction, and more particularly, to techniques for correcting errors and erasures using a single-shot generalized minimum distance (GMD) key equation solver.

A hard disk drive is a data storage device that records digital data on a non-volatile magnetic disk. After data has been recorded on the disk, the data can be read from the disk using a read sensor. The data read from the disk often contains errors. Various systems have been proposed for detecting and correcting errors in data read from a magnetic disk in a hard disk drive.

BRIEF SUMMARY OF THE INVENTION

A system corrects errors in a codeword. The system includes a channel that sorts reliability numbers of symbols in the codeword to create an ordered list of candidate erasure locations. The system also includes a generalized minimum distance decoder that iteratively processes the ordered list of candidate erasure locations and at least two syndromes of the codeword using a single-shot key equation solver to generate an error locator polynomial and an error evaluator polynomial. The generalized minimum distance decoder processes the least reliable candidate erasure locations first within the ordered list of candidate erasure locations. The present invention includes methods and systems for performing the embodiments described herein.

Various objects, features, and advantages of the present invention will become apparent upon consideration of the following detailed description and the accompanying drawings.

DETAILED DESCRIPTION OF THE INVENTION

Figure 1A:
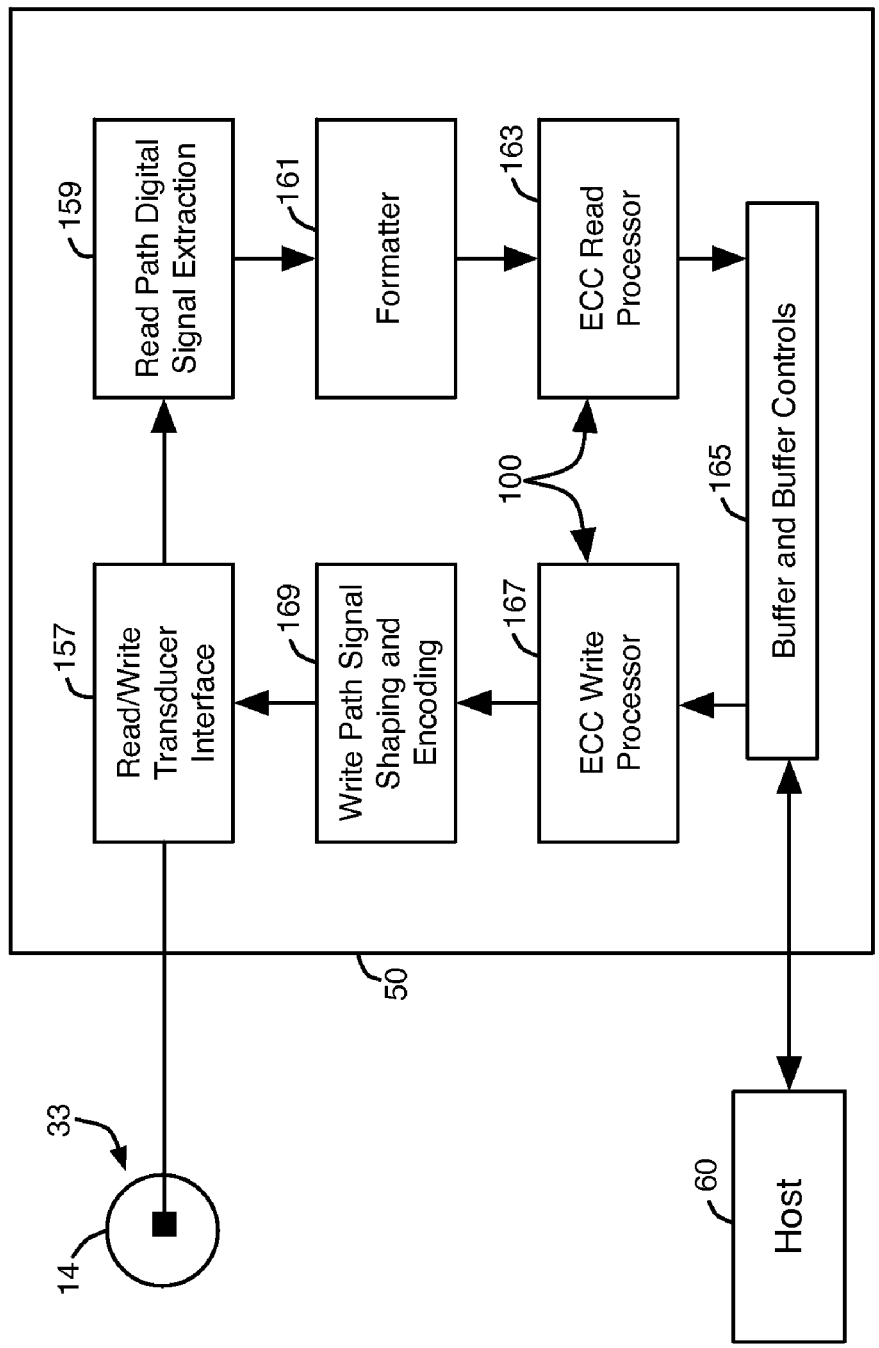
FIG. 1A is a block diagram of a hard disk drive system.
Figure 1B:
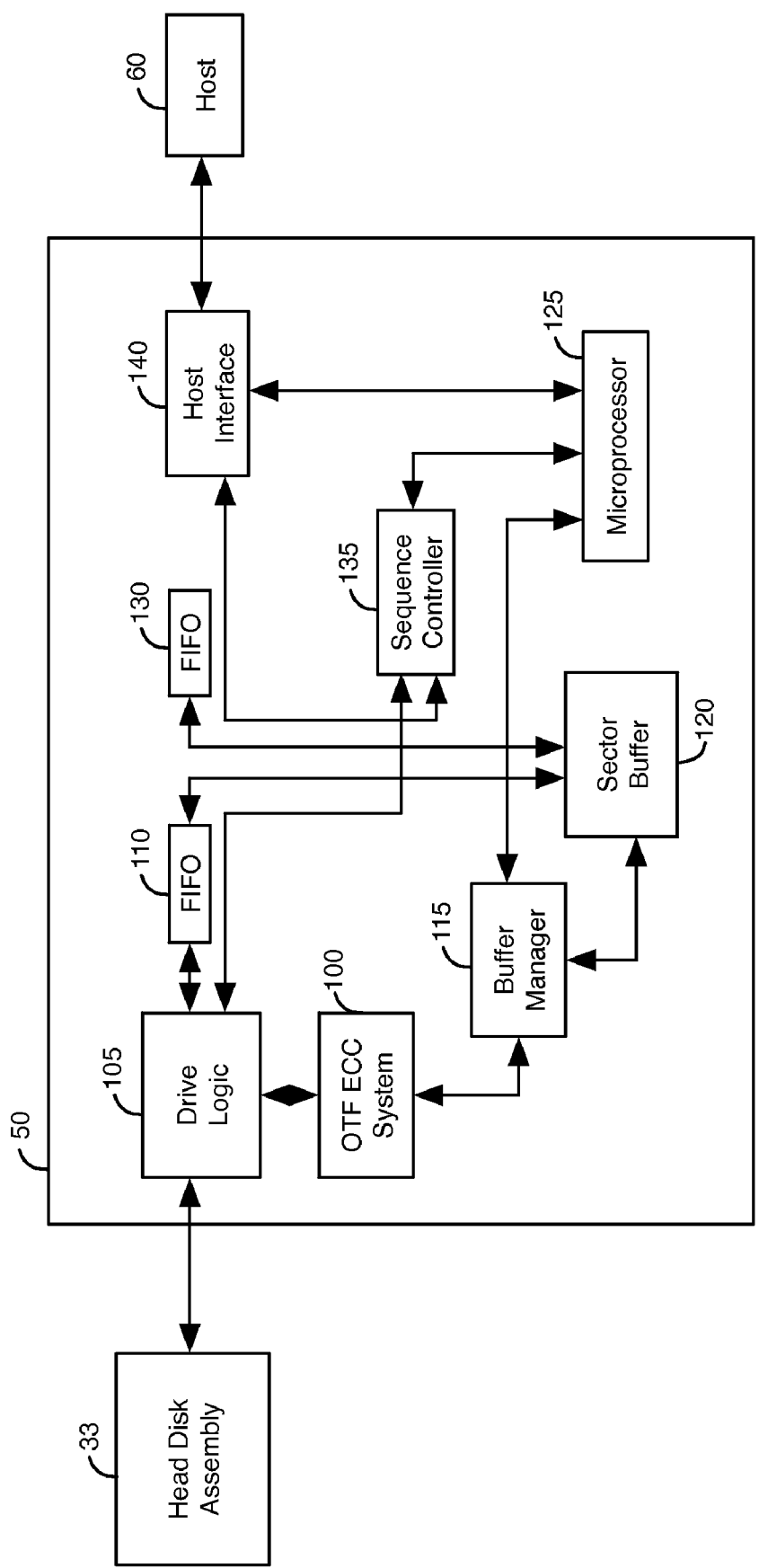
FIG. 1B is a block diagram of the architecture of a hard disk drive controller.

FIGS. 1A and 1B illustrate an example of a hard disk drive control system for reading and writing data onto a magnetic hard disk. FIG. 1A is a block diagram of a hard disk drive system, and FIG. 1B is a block diagram of the architecture of a hard disk drive controller. The hard disk drive control system of FIGS. 1A-1B is an example of a hard disk drive system that can implement embodiments of the present invention. The hard disk drive system of FIGS. 1A-1B can detect and correct errors in the data read from a magnetic hard disk.

FIGS. 1A-1B illustrate an exemplary architecture of a buffered hard disk drive controller 50. Hard disk drive controller 50 is configured to read data from and write data to a magnetic hard disk 14 shown in FIG. 1A. Controller 50 includes an on-the-fly (OTF) error correction code (ECC) system 100 for implementing an on-the-fly error correction code.

On-the-fly error correction code system 100 includes an ECC read processor 163 and an ECC write processor 167 as shown in FIG. 1A. When sequences of digital binary data are to be written onto disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from head disk assembly 33, for example, from 8 bits to 32 bits. Head disk assembly 33 includes disk 14 and a head stack assembly. The head stack assembly includes a spindle motor. A first-in-first-out (FIFO) register 110 stores the formatted data and exchanges the formatted data with a sector buffer 120. The ECC system 100 receives the formatted data from the drive logic circuit 105 and performs an error correction encoding algorithm.

A buffer manager 115 controls data traffic between ECC system 100, a sector buffer (i.e., random access memory) 120, and a microprocessor 125. Another FIFO register 130 stores data and exchanges the data with the sector buffer 120. A sequence controller 135 is connected between drive logic circuit 105, microprocessor 125, and a host interface 140, to control the sequence operation of the data traffic and various commands across the hard disk drive controller 50. The host interface 140 provides an interface between the hard disk drive controller 50 and a host 60.

First, a predetermined number of binary data symbols in a data string are moved from the buffer 165 and streamed through an ECC write processor 167. In the ECC write processor 167, an error correction encoder maps the data symbols into codewords drawn from a Reed-Solomon (RS) code. For each data symbol, the Reed-Solomon (RS) encoder generates error correction check bytes. The check bytes are appended to the symbols to generate Reed-Solomon (RS) codewords.

Thus, each RS codeword includes data symbols and check bytes. A codeword, for example, can have about 450 data symbols, where each data symbols has 10 bits. This example is provided for illustration and it not intended to limit the scope of the present invention.

Next, each codeword is mapped in a write path signal-shaping unit 169 into a run length limited or other bandpass or spectral-shaping code and changed into a time-varying signal. The time-varying signal is applied through a read/write transducer interface 157 to the write element in a magneto resistive read/write head (or other suitable transducer head) for conversion into magnetic flux patterns. The magnetic flux patterns are applied to disk 14, and as a result, the codewords are recorded on disk 14.

All of the measures starting from the movement of the binary data elements from buffer 165 until the magnetic flux patterns are written on a selected disk track as the rotating disk 14 passes under the read/write head are synchronous and streamed. For the purpose of efficient data transfer, the data is de-staged (written out) or staged (read) a codeword at a time.

Thus, both the mapping of binary data into Reed-Solomon (RS) codewords and the conversion to flux producing time-varying signals are performed within the time interval defining a unit of recording track length moving under the transducer. A typical unit of recording track length is an equal fixed-length byte codeword of 512 bytes.

When sequences of magnetic flux patterns are to be read from the disk 14, they are processed in a channel (157, 159, 161, and 163) and written into the buffer 165. The time-varying signals sensed by a transducer are passed through the read/write transducer interface 157 to a digital signal extraction unit 159. Here, the signals are detected and a decision is made as to whether each signal should be resolved as a binary 1 or a binary 0 to reconstruct the information recorded on disk 14. As these 1's and 0's stream out of the signal extraction unit 159, they are arranged into codewords in the formatting unit 161.

Because the read path is evaluating sequences of RS codewords previously recorded on the disk 14, absent error or erasure, the codewords should be the same. In order to check for errors in the codewords, each codeword read from disk 14 is applied to a Reed-Solomon (RS) decoder in ECC read processor 163 over a path from formatter 161. The RS decoder detects and corrects errors in the codewords. Decoding techniques of the present invention can, for example, be performed in ECC read processor 163.

The output from ECC read processor 163 is written into buffer 165. The read path also operates in a synchronous data-streaming manner such that any detected errors are located and corrected within the codeword in time for ECC read processor 163 to receive the next codeword read from the track of disk 14. Buffer 165 and the read and write channels may be monitored and controlled by microprocessor 125.

The RS decoder in ECC read processor 163 decodes the RS codewords to correct any errors in the codewords. The RS decoder includes a syndrome computation block, a key-equation solver (KES) block, and a Chien search and error evaluator (CSEE) block. The syndrome computation block computes the syndromes of each codeword, which are viewed as coefficients of a syndrome polynomial S(x). The syndromes are passed to the KES block.

If there are any non-zero syndromes, it is assumed that there is an error in the codeword. The KES block solves equation (1) to determine the error locator polynomial v(x) and the error evaluator polynomial P(x), where t is the number of errors that the RS code can correct.

$$v(x)S(x) \equiv P(x) \bmod x^{2t} \qquad (1)$$

The error locator and error evaluator polynomials are then passed to the CSEE block. The CSEE block calculates the error locations and the error values. The decoder can find the error locations by checking whether $v(a^{-j})=0$ for each j, where j ranges over the codeword length. This process is called a Chien search. If $v(a^{-j})=0$, then each $a^j$ is one of the error locations. Each of the roots $a^{-j}$ of the error locator polynomial v(x) is the reciprocal of an error location. The error values $e_i$ are calculated using Forney's error value formula (2).

$$e^i = \frac{P(x)}{v'(x)}\bigg|x = a^{-ji} \qquad (2)$$

In equation (2), v'(x) denotes the formal derivative of the error locator polynomial v(x). The CSEE block corrects the errors in each received codeword as it is being read out of the decoder by subtracting the error values $e_i$ from symbols at the found error locations in the received codeword.

The present invention includes techniques for generalized minimum distance (GMD) decoding using a single-shot key equation solver (KES) algorithm. The polynomial division is removed from the KES. Instead, the GMD probability calculation is replaced with an algebraic GMD criterion calculation. The GMD probabilistic criterion is translated into an algebraic criterion to provide a KES that is suitable for an on-the-fly (OTF) implementation. Embodiments of the present invention can be used in data storage devices such as hard disk drives.

Figure 2:
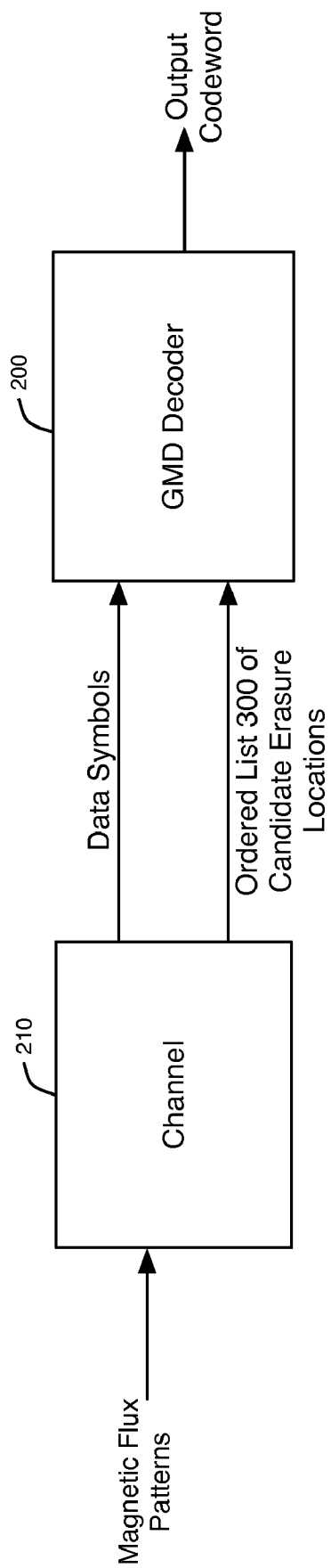
FIG. 2 illustrates a system for correcting errors in a data stream, according to an embodiment of the present invention.

FIG. 2 illustrates a system for correcting errors in a data stream, according to an embodiment of the present invention. The system of FIG. 2 includes a channel 210 and a generalized minimum distance (GMD) decoder 200. The system of FIG. 2 can be included in a hard disk drive, or in another type of data storage device. Channel 210 receives magnetic flux patterns from a magnetic disk in a hard disk drive and generates data symbols and an ordered list 300 of candidate erasure locations. GMD decoder 200 receives data symbols and the ordered list 300 of candidate erasure locations as input signals. Data symbols are also referred to herein as symbols.

Channel 210 generates reliability numbers for the data symbols. The reliability numbers are soft information. The reliability numbers indicate the reliability of the data symbols. Channel 210 then sorts the reliability numbers to generate an ordered list 300 of candidate erasure locations.

GMD decoder 200 uses the data symbols, the ordered list 300 of candidate erasure locations, and syndromes generated by a syndrome generator to calculate the error locator and evaluator polynomials. Then, decoder 200 solves the error locator and error evaluator polynomials to generate error locations and error values. Decoder 200 uses the error locations and error values to correct any errors in the input data symbols in each codeword. After errors in the input data symbols of the input codeword have been corrected, GMD decoder 200 generates a corrected output codeword.

The output codeword generated by GMD decoder 200 represents the most reliable codeword in the sense of a generalized minimum distance (GMD). The generalized minimum distance is the Hamming distance, where each data symbol in a codeword is weighted by its reliability number.

Figure 3:
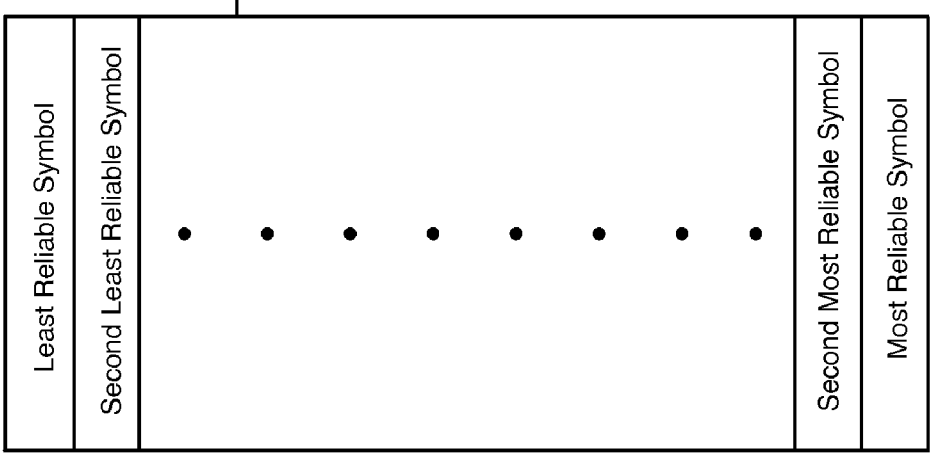
FIG. 3 illustrates an ordered list of candidate erasure locations for a codeword, according to an embodiment of the present invention.

One of the reliability numbers generated by channel 210 is attached to each symbol in a codeword. The reliability numbers are used to determine the reliability of each symbol in the codeword. Channel 210 generates an ordered list of candidate erasure locations 300 for the codeword based on the reliability of each symbol in the codeword, as shown in FIG. 3. List 300 of candidate erasure locations is a list of erasure pointers that point to the locations of the symbols in the codeword. The list 300 of candidate erasure locations indicates the locations of the symbols within the codeword that locate the symbols having the lowest reliabilities. List 300 can have any suitable number of candidate erasure locations.

The candidate erasure locations are ranked in list 300 based on the reliability of each symbol in increasing reliability order, with the least reliable symbol in the codeword at the top of list 300, and the most reliable symbol in the codeword at the bottom of list 300, as shown in FIG. 3. The reliability of each symbol in list 300 is based on one of the reliability numbers generated by channel 210. The number of symbols in list 300 is less than or equal to 2t, where 2t is the number of checks in the codeword, and t is the number of correctable errors in the codeword.

GMD decoder 200 uses a single-shot key equation solver (KES). GMD decoder 200 does not analyze all possible subsets of the candidate erasure locations in list 300 as possible erasures. Instead, GMD decoder 200 determines the candidate erasure locations of symbols in list 300 that are the least reliable symbols as indicated by the reliability numbers. GMD decoder 200 then marks the least reliable candidate erasure locations in list 300 as erasures. GMD decoder 200 marks only the subset of the candidate erasure locations that optimizes the decoder as erasures. GMD decoder 200 removes the least reliable candidate erasure locations that are selected as erasures from list 300. The least reliable candidate erasure locations that are removed from list 300 are referred to as the removed set of erasures.

Decoder 200 evaluates one candidate erasure location in list 300 in each iteration of the single-shot KES, except in the last iteration. The candidate erasure locations that have been evaluated and that remain in list 300 after the least reliable candidate erasure locations have been removed from list 300 are referred to as the residual set of erasures.

The syndrome polynomial is shown below in equation (3) and the erasure locations are shown below in equation (4). In equation (4), $E_0$ is the worst erasure pointer.

$$S(x) = \sum_{j=0}^{2t-1} S_j x^j, \quad S_j = rcvd(\alpha^{2t-i-1}), \quad (3)$$

$$i = 0, 1, \ldots, 2t-1$$

$$E = [E_0, E_1, \ldots, E_{2t-1}] \quad (4)$$

The alternative algebraic GMD criterion starts the KES with the error evaluator polynomial values at all erasure locations. GMD decoder 200 computes the error evaluator polynomial values at all erasure locations during an initialization process. The initialization process takes 2t cycles for the initial error evaluator polynomial P-vector calculation, where t is the number of correctable errors, and 2t storage units are used for the degree 2t polynomial recursion. Decoder 200 uses t additional multipliers for the degree 2t polynomial recursion. The error evaluator polynomial initial value vector P is shown below in equation (5), and the set of modified erasures Q is shown below in equation (6).

$$P = [\hat{S}(E_0), \hat{S}(E_1), \ldots, \hat{S}(E_{2t-1})], \quad (5)$$

where $$\hat{S}(x) = S(x) \prod_{i=0}^{2t-1}(x - E_i) \bmod x^{2t}$$

$$Q = [E_0^{2t}, E_1^{2t}, \ldots, E_{2t-1}^{2t}] \quad (6)$$

During initialization, the error locator polynomial v(x)=1, the best error locator polynomial $v_{best}(x)$=1, the auxiliary error locator polynomial u(x)=0, the best auxiliary error locator index $k_{best}$=0, control parameter δ=2t, and $z_{val} \leftarrow \#_{0's}(\{P_j\}_{j=0}^{2t-1})$. $z_{val}$ is a variable that is assigned to the number of zeros ($\#_{0's}$) in the error evaluator polynomial.

GMD decoder 200 uses a "ROOTS-2" strategy plus 1 final "ROOTS" criterion evaluation. The "ROOTS-2" strategy is performed in multiple iterations of the key equation solver (KES) algorithm. The 1 final "ROOTS" criterion evaluation is performed in the last iteration of the key equation solver to confirm the final error locator.

The residual set of erasures is the set of candidate erasure locations that have been evaluated by the single-shot KES and that remains in list 300 after the least reliable candidate erasure locations have been removed from list 300. During each of the KES iterations (except the last iteration), GMD decoder 200 evaluates one of the symbols in list 300, and GMD decoder 200 counts the number of zeros in the error evaluator polynomial at the residual set of erasures. The maximum number of zeros in the error evaluator polynomial at the residual set of erasures is the "ROOTS-2" GMD criterion that is used to update the best error locator index $k_{best}$.

In the last KES iteration, the "ROOTS-2" GMD calculation is replaced with a "ROOTS" GMD calculation, because the "ROOTS-2" GMD calculation is unavailable in this last step (i.e., the residual set of erasures is empty). In the "ROOTS" GMD calculation in the last KES iteration, decoder 200 counts the number of zeros in the error locator polynomial at the set of removed erasures from list 300. In the last KES iteration, decoder 200 evaluates the "best" chosen error locator at the erasures in the list of removed erasures. This is the "ROOTS" criterion for choosing the final error locator. The best error locator polynomial $v_{best}(x)$ has the maximum number of zero values when evaluated in the set of removed erasures. The least reliable candidate erasure locations in list 300 are the set of removed erasures. Decoder 200 performs the last iteration of the KES in t cycles.

The algebraic criterion used in the single-shot key equation solver (KES) is based on the principle that the incorrect error locator polynomial has a random behavior at the set of removed erasures. The correct error locator polynomial has a large number of zero values at the set of removed erasures. The set of removed erasures generates the maximum number of zeros in the error locator polynomial if the set of removed erasures contains the least reliable symbols. Typically, many polynomial evaluations are performed inside the key equation solver (KES).

The single-shot key equation solver (KES) algorithm is shown below in detail. The KES begins with the following for loop, which performs multiple iterations of the "ROOTS-2" strategy.

```
for k = 0, 1, 2, ..., 2t -1
    if P_k = 0, then
        δ ← δ - 1
        u(x) ← (x - E_k)u(x)
        Q ← [E - E_k].* Q
    elseif Q_k ≠ 0, δ ≧ 2t + 1 then
        δ ← δ - 1
        v(x) ← v(x) - (P_k/Q_k)u(x)
        u(x) ← (x - E_k)u(x)
        P ← P - (P_k/Q_k)Q
        Q ← [E - E_k].* Q
    else
        δ ← δ + 1
        u(x) ← u(x) - (Q_k/P_k)v(x)
        v(x) ← (x - E_k)v(x)
        Q ← Q - (Q_k/P_k)P
        P ← [E - E_k].* P
    if δ ≦ 2t, #_0's ({P_j}_{j=k+1}^{2t-1}) ≧ z_val
        then z_val ← #_0's ({P_j}_{j=k+1}^{2t-1}), v_best(x) ← v(x), k_best ← k + 1
```

In the above for loop, δ is a control parameter, $v_{best}$ is the best error locator polynomial, k is an index of the for loop, $k_{best}$ is the best error locator index, $\#_{0's}$ is the number of zeros in the error evaluator polynomial, u(x) is the auxiliary error locator polynomial, and "." refers to scalar vector product. After the for loop shown above completes all of the "ROOTS-2" iterations, the last KES iteration is performed using the algorithm shown below.

```
if #0's ({v(E_j)}_{j=0}^{2t-1} ≧ z_val, deg(v) ≦ t
    then v_best(x) ← v(x), k_best ← 2t
Output: [v_best(x), 2t - k_best]
```

The output $v_{best}(x)$, $2t-k_{best}$ is the final result of the KES following the last KES iteration. Decoder 200 performs the last KES iteration in t cycles.

The codewords that decoder 200 receives from the hard disk or other data storage medium may include errors. Each received codeword can be written as w=c+e, where w is the received codeword, c is the correct codeword vector, and e is the error vector. Decoder 200 locates the error values $e_i$. The error locator has roots in error locations, not in the inverse error locations. Decoder 200 uses a modified Forney algorithm to compute error values. The modified Forney algorithm is shown below in equation (7).

$$e_i = \frac{u(x)}{x^{2t}(v(x)\psi(x))'}\bigg|_{x=i^{th} \text{ error location}} \quad (7)$$

In equation (7), $$\psi(x) = \prod_{j=0}^{N_e-1}(x - E_{2-t-1-j}), N_e = \text{the number of erasures,}$$

$u(x)=v(x)\psi(x)S(x) \bmod x^{2t}$, $v(x)$ is the error locator polynomial, and $u(x)$ is the auxiliary error locator polynomial.

Figure 4:
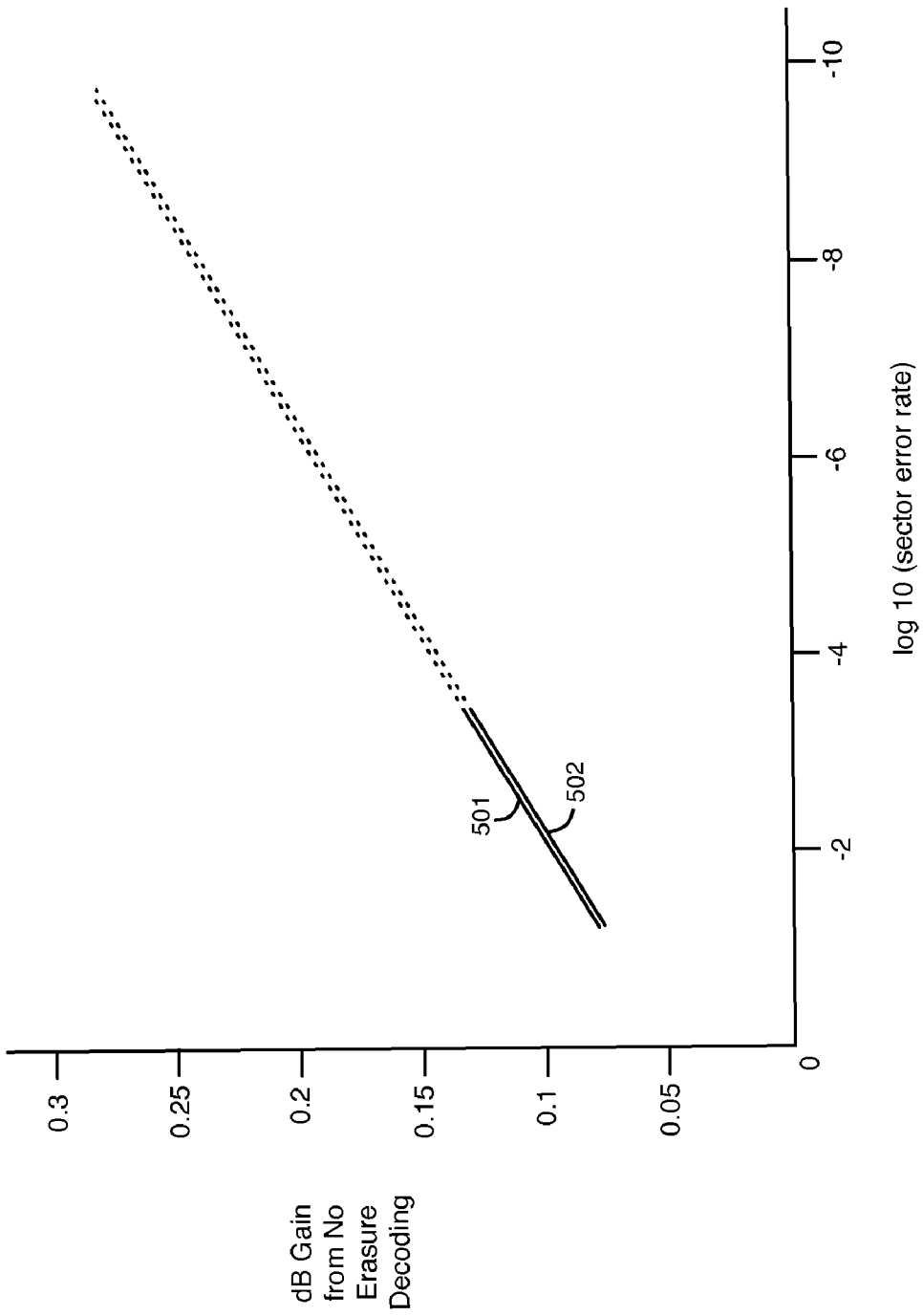
FIG. 4 is a graph that illustrates an example of the gain of the decoder of FIG. 2 over a range of sector error rates, according to an embodiment of the present invention.

FIG. 4 is a graph that illustrates an example of the gain of GMD decoder 200 over a range of sector error rates, according to an embodiment of the present invention. Line 501 is the gain of a standard multiple-trial GMD decoder, and line 502 is the gain of the single-shot GMD decoder 200. The x-axis in FIG. 4 represents the sector error rates in log 10 (logarithm 10). The dotted lines in FIG. 4 are the linear extensions of lines 501 and 502 up to a sector error rate of $10^{-10}$. As shown in FIG. 4, GMD decoder 200 has a 0.15 decibel (dB) gain at a $10^{-5}$ sector error rate and a 0.25 dB gain at a $10^{-9}$ sector error rate. GMD decoder 200 achieves essentially equivalent performance as a GMD decoder that uses 20 decode attempts in the KES.

The foregoing description of the exemplary embodiments of the present invention has been presented for the purposes of illustration and description. It is not intended to be exhaustive or to limit the present invention to the examples disclosed herein. In some instances, features of the present invention can be employed without a corresponding use of other features as set forth. Many modifications, substitutions and variations are possible in light of the above teachings, without departing from the scope of the present invention. For example, embodiments of the present invention can be implemented using one or a combination of hardware, software, and a computer-readable medium containing program instructions. Software implemented by embodiments of the present invention and results of the present invention can be stored on a computer-readable medium such as memory, hard disk drive, compact disc (CD), digital video disc (DVD), or other media. Results of the present invention can be used for various purposes such as being executed or processed by a processor, being displayed to a user, transmitted in a signal over a network, etc.

What is claimed is:

1. A system for correcting errors in a codeword, the system comprising:
   a channel that sorts reliability numbers of symbols in the codeword to create an ordered list of candidate erasure locations; and
   a generalized minimum distance decoder that iteratively processes the ordered list of candidate erasure locations and at least two syndromes of the codeword using a single-shot key equation solver to generate an error locator polynomial and an error evaluator polynomial,
   wherein the generalized minimum distance decoder processes the least reliable candidate erasure locations first within the ordered list of candidate erasure locations.

2. The system defined in claim 1 wherein the generalized minimum distance decoder evaluates symbols and counts a number of zeros in the error evaluator polynomial at a residual set of erasures in multiple iterations of the single-shot key equation solver, the residual set of erasures comprising evaluated candidate erasure locations that remain among the ordered list of candidate erasure locations after the least reliable candidate erasure locations have been removed from the ordered list of candidate erasure locations.

3. The system defined in claim 2 wherein the maximum number of zeros in the error evaluator polynomial at the residual set of erasures is a generalized minimum distance criterion that is used to update a best error locator index.

4. The system defined in claim 2 wherein the generalized minimum distance decoder counts a number of zeros in the error locator polynomial at a set of removed erasures in a last iteration of the single-shot key equation solver, and a best error locator polynomial has a maximum number of zero values when evaluated in the set of removed erasures, the set of removed erasures being the least reliable candidate erasure locations.

5. The system defined in claim 4 wherein the generalized minimum distance decoder computes the error evaluator polynomial at all erasure locations during an initialization process, the initialization process taking 2t cycles, where t is a number of correctable errors.

6. The system defined in claim 1 wherein the generalized minimum distance decoder solves the error locator polynomial and the error evaluator polynomial to generate error locations and error values, and uses the error locations and the error values to correct errors in the codeword in order to generate a corrected output codeword.

7. The system defined in claim 1 wherein the system is a hard disk drive, and the codeword is read from a magnetic disk in the hard disk drive.

8. A method for correcting errors in a codeword performed by a data storage device, the method comprising:
   generating reliability numbers for symbols in the codeword;
   sorting the reliability numbers to generate a sorted list of candidate erasure locations for the symbols in the codeword; and
   iteratively processing the sorted list of candidate erasure locations and at least two syndromes of the codeword to generate an error locator polynomial and an error evaluator polynomial using a single-shot generalized minimum distance key equation solver,
   wherein the reliability numbers are arranged such that the single-shot generalized minimum distance key equation solver processes the least reliable candidate erasure locations first within the sorted list of candidate erasure locations.

9. The method defined in claim 8 wherein iteratively processing the sorted list of erasure candidate locations and at least two syndromes of the codeword to generate the error locator polynomial and the error evaluator polynomial using the single-shot generalized minimum distance key equation solver further comprises counting a number of zeros in the error evaluator polynomial at a residual set of erasures in multiple iterations of the single-shot generalized minimum distance key equation solver, the residual set of erasures comprising evaluated candidate erasure locations that remain in the sorted list of candidate erasure locations after the least reliable candidate erasure locations have been removed from the sorted list of candidate erasure locations.

10. The method defined in claim 9 wherein the maximum number of zeros in the error evaluator polynomial at the residual set of erasures is a generalized minimum distance criterion that is used to update a best error locator index.

11. The method defined in claim 9 wherein iteratively processing the sorted list of candidate erasure locations and at least two syndromes of the codeword to generate the error locator polynomial and the error evaluator polynomial using the single-shot generalized minimum distance key equation solver further comprises counting a number of zeros in the error locator polynomial at a set of removed erasures in a last iteration of the single-shot key equation solver, and a best error locator polynomial has a maximum number of zero values when evaluated in the set of removed erasures, the set of removed erasures being the least reliable candidate erasure locations.

12. The method defined in claim 11 wherein iteratively processing the sorted list of candidate erasure locations and at least two syndromes of the codeword to generate the error locator polynomial and the error evaluator polynomial using the single-shot generalized minimum distance key equation solver further comprises computing the error evaluator polynomial at all erasure locations during an initialization process, the initialization process taking 2t cycles, where t is a number of correctable errors.

13. The method defined in claim 8 further comprising:
solving the error locator polynomial and the error evaluator polynomial to generate error locations and error values; and
using the error locations and the error values to correct errors in the codeword in order to generate a corrected codeword.

14. The method defined in claim 8 wherein the method is performed by a hard disk drive, and the codeword is read from a magnetic disk in the hard disk drive.

15. A hard disk drive that corrects errors in a codeword read from a magnetic disk, the hard disk drive comprising:
a channel that sorts reliability numbers of symbols in the codeword to create an ordered list of candidate erasure locations; and
a decoder using a single-shot generalized minimum distance key equation solver to iteratively process the ordered list of candidate erasure locations and at least two syndromes of the codeword to generate an error locator polynomial and an error evaluator polynomial, wherein the single-shot generalized minimum distance key equation solver processes the least reliable candidate erasure locations first within the ordered list of candidate erasure locations.

16. The hard disk drive defined in claim 15 wherein the single-shot generalized minimum distance key equation solver evaluates the symbols and counts a number of zeros in the error evaluator polynomial at a residual set of erasures in multiple iterations of the single-shot generalized minimum distance key equation solver, the residual set of erasures being evaluated symbols that remain in the ordered list of candidate erasure locations after the least reliable candidate erasure locations have been removed from the ordered list of candidate erasure locations.

17. The hard disk drive defined in claim 16 wherein the maximum number of zeros in the error evaluator polynomial at the residual set of erasures is a generalized minimum distance criterion that is used to update a best error locator index.

18. The hard disk drive defined in claim 16 wherein the decoder counts a number of zeros in the error locator polynomial at a set of removed erasures in a last iteration of the single-shot generalized minimum distance key equation solver, and a best error locator polynomial has a maximum number of zero values when evaluated in the set of removed erasures, the set of removed erasures being the least reliable candidate erasure locations.

19. The hard disk drive defined in claim 18 wherein the decoder computes the error evaluator polynomial at all erasure locations during an initialization process, the initialization process taking 2t cycles, where t is a number of correctable errors.

20. The hard disk drive defined in claim 15 wherein the decoder solves the error locator polynomial and the error evaluator polynomial to generate error locations and error values, and uses the error locations and the error values to correct errors in the codeword in order to generate a corrected output codeword.

* * * * *